(12) United States Patent
Sunter

(10) Patent No.: US 6,691,269 B2
(45) Date of Patent: Feb. 10, 2004

(54) METHOD FOR SCAN CONTROLLED SEQUENTIAL SAMPLING OF ANALOG SIGNALS AND CIRCUIT FOR USE THEREWITH

(75) Inventor: Stephen K. Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 500 days.

(21) Appl. No.: 09/768,501

(22) Filed: Jan. 25, 2001

(65) Prior Publication Data

US 2002/0099990 A1 Jul. 25, 2002

(30) Foreign Application Priority Data

Dec. 22, 2000 (CA) .............................. 2329597

(51) Int. Cl.[7] ................. G01R 31/3185; G01R 31/3167
(52) U.S. Cl. ...................... 714/727; 714/724; 714/726; 324/763
(58) Field of Search ................................ 714/724, 726, 714/727; 324/763

(56) References Cited

U.S. PATENT DOCUMENTS

| | | | |
|---|---|---|---|
| 5,526,365 A | | 6/1996 | Whetsel |
| 5,610,530 A | | 3/1997 | Whetsel |
| 5,677,915 A | | 10/1997 | Whetsel |
| 5,847,561 A | * | 12/1998 | Whetsel .................... 324/158.1 |
| 5,887,001 A | * | 3/1999 | Russell ........................ 714/726 |
| 5,968,191 A | | 10/1999 | Thatcher et al. |
| 6,006,343 A | | 12/1999 | Whetsel |
| 6,122,284 A | | 9/2000 | Tasdighi et al. |
| 6,339,388 B1 | * | 1/2002 | Matsumoto .................. 341/120 |
| 2002/0078411 A1 | * | 6/2002 | D'Abreu |

FOREIGN PATENT DOCUMENTS

WO     WO 2052289 A1 * 7/2002

OTHER PUBLICATIONS

IEEE standard for a mixed–signal test bus; IEEE Std 1149.4–1999, □□Mar. 28, 2000; ISBN 0–7381–1756–0.*
S.K. Sunter, "Cost/Benefit Analysis of the P1149.4 Mixed–Signal Test Bus", IEE Proc.—Circuit Devices Syst., vol. 143, No. 6, Dec. 6, 1996.
Cron A.: "IEEE P1149.4—Almost a Standard", Proceedings of the International Test Conference, Washington D.C., Nov. 1–6, 1997, pp. 174–182.

(List continued on next page.)

Primary Examiner—R. Stephen Dildine
(74) Attorney, Agent, or Firm—Eugene E. Proulx

(57) ABSTRACT

A method for sequentially accessing circuit nodes in an IEEE 1149.4 compatible mixed-signal circuit having a test access port controller, a boundary scan register having a boundary module associated with each circuit node, analog busses for accessing the circuit nodes and connecting the analog bus pins and each boundary module, the boundary modules having analog switches for selectively accessing the busses, shift register elements and associated update latches for controlling the analog switches, the method comprising initializing the boundary modules with logic values including an analog switch enabling logic value for enabling a switch associated with a first of the circuit nodes and enabling the switch; monitoring or driving the first signal node via the analog busses; suppressing capture mode in each boundary module; and for each additional circuit node to be accessed, shifting the switch enabling logic value from the boundary module containing the logic value to the boundary module associated with the next signal node to be accessed, enabling a switch associated therewith; and monitoring or driving the next signal node via the analog bus.

21 Claims, 12 Drawing Sheets

OTHER PUBLICATIONS

Verfaillie, J. et al., "A general Purpose Design–For–Test Methodology at the Analog–DigitaLL Boundary of Mixed–Signal VLSI", Journal of Electronic Testing, Kluwer Academic Publishers, Dordrecht, NL, vol. 9, No. 1/2, Aug. 1, 1996, pp. 109–115.

Agrawal, Vishwani D.: "Design for Mixed–Signal Systems for Testability", Integration, the VLSI Journal, North–Holland Publishing Company, Amsterdam, NL, vol. 26, No. 1/2, Dec. 1998, pp. 141–150.

* cited by examiner

METHOD FOR SCAN CONTROLLED SEQUENTIAL SAMPLING OF ANALOG SIGNALS AND CIRCUIT FOR USE THEREWITH

The present invention relates generally to testing of integrated circuits and, more specifically, to a method for performing fast sequential access of circuit nodes and a circuit for use therewith.

BACKGROUND OF THE INVENTION

As the density of circuit boards containing integrated circuits (ICs) increases, it becomes more difficult to access the board signal wires using metal probes, or a "bed of nails". This has led to the development by members of the Institute of Electrical and Electronic Engineers (IEEE) of two test standards for circuit board testing. The standard for accessing digital signals of integrated circuit (IC) pins is denoted 1149.1 and was first published in 1990. An extension to the 1149.1 standard that is aimed at accessing analog signals is denoted 1149.4 and was first published Mar. 28, 2000, though preliminary drafts of the standard were available to many people prior to that date.

The 1149.4 standard will be better understood by reference to FIG. 1 which illustrates general architecture of an IC 10 which contains 1149.4 test access circuitry. The 1149.4 standard extends the 1149.1 digital test access port (TAP) 12 by adding two analog test bus pins 14 and 16, denoted AT1 and AT2, to allow the signal at any function pin of an IC to be accessed via these two pins. To monitor the voltage at a function pin 18 via an analog test bus pin 16, two switches are enabled. As shown in FIG. 2, which illustrates an analog boundary module (ABM) 20, one switch 22 (or 24) for function pin 18, and one (not shown) in a test bus interface circuit (TBIC) 26 for the IC. Common signals generated by the TAP to control all ABMs may include ShiftDR 30, ClockDR 32, UpdateDR 34, and one or more Mode signals 36 and 38. To enable the two switches, appropriate logic bits are shifted serially, or "scanned", through a boundary scan register (BSR) linked by wires following the path of dashed line 40, such that a scan register update latch 42 (or 44) controlling each switch is loaded with the logic bits. The boundary scan shift register has N bits, where N is any non-zero integer, and hence N or more clock cycles are required to shift in bits to all of the boundary scan shift register elements (or stages).

Each time a function pin signal is to be accessed, it is necessary to perform at least the sequence of steps described below (where "toggle" means "generate a rising and falling edge on"), according to the 1149.1/1149.4 TAP controller state diagram shown in FIG. 3 (and in the waveforms of FIG. 7). The numerals 1 or 0 adjacent the states are prescribed values of the TMS input to the TAP.

The sequence of steps are: 1. while TMS=1, toggle TCK to proceed from Run-test/Idle state 50, Update-DR state 52 or Update-IR state 54 to Select-DR-Scan state 56; 2. while TMS=0, toggle TCK to proceed from Select-DR-Scan state 56 to Capture-DR state 58, in which new data overwrites the BSR contents via multiplexer 60 (FIG. 2) and other multiplexers; 3. while TMS=0, toggle TCK to proceed from Capture-DR state 58 to Shift-DR state 62; 4. while TMS=0, repeatedly toggle TCK to scan in N bits to completely fill the BSR shift register elements 64, 66, 68 and 70, in FIG. 2; 5. while TMS=1, toggle TCK to proceed from Shift-DR state 62 to Exit1-DR state 72; and 6. while TMS=1, toggle TCK to proceed from Exit1-DR state 72 to Update-DR state 52, which updates all update latches 42, 44, 74 and 76, in FIG. 2 to output new bit values.

The minimum number of TCK clock cycles to select a different analog switch to be enabled is therefore $N_{TCK}$=4+N. The number of boundary scan shift register bits per ABM, as required by 1149.4, is four (elements 64, 66, 68, 70, in FIG. 2). Four shift register bits are also required in the TBIC 26. Some of the pins of the IC may be digital, and hence may not have an associated ABM—these pins may have only one boundary scan bit per pin and still be compatible with 1149.4 and 1149.1. Although 1149.4 is intended to provide analog access to analog pins, it can also be used to provide analog access to digital pins as suggested by S. Sunter in "Cost/benefit analysis of the P1149.4 mixed-signal test bus" in *IEE Proceedings, Circuits, Devices, and Systems*, December 1996, on pages 394 and 395. This allows a tester to measure the DC characteristics of all pins of an IC via the TAP and analog bus pins, thus greatly reducing the number of probes needed to probe ICs on a wafer and the number of channels needed in a tester. To enable this simplification in test equipment, every pin must have an ABM. Therefore, for an IC with P pins, N=4P+4 bits would be needed. For P>100, N is approximately equal to 4P.

Clock frequencies for TCK, when testing a stand-alone IC, typically range from $f_{TCK}$=1 MHz to $f_{TCK}$=50 MHz. The time to scan in N bits is $N_{TCK}/f_{TCK}$. If the time to measure each pin's voltage is $T_{Measure}$, the total time per pin measurement is $T_{Measure}+N_{TCK}/f_{TCK}$. The time to measure the voltage at P pins is therefore:

$$P(T_{Measure}+N_{TCK}/f_{TCK})=P(T_{Measure}+4P/f_{TCK})=PT_{Measure}+4P^2/f_{TCK}$$

which is proportional to the square of the number of pins.

To measure the standard DC characteristics of a pin, six voltages must be measured, corresponding to: output drive low (IOL), output drive high (IOH), input leakage low (IIL), input leakage high (IIH), maximum input voltage for a logic 0 (VIL) and minimum input voltage for logic 1 (VIH). Therefore the total time to measure/apply 6 voltages for an IC with P pins is:

$$6P(T_{Measure}+4P/f_{TCK})=6PT_{Measure}+24P^2/f_{TCK}$$

For an IC with 100 signal pins, $f_{TCK}$=10 MHz, and $T_{Measure}$=10 μs, the test time would be approximately 27 ms, and the number of test vectors would be 270,000. For an IC with 1000 signal pins and $F_{TCK}$=10 MHz, the test time would be approximately 2.7 seconds, and the number of test vectors would be 27,000,000. The test time for a conventional tester having parallel access to all signal pins of the IC, and having a parametric measurement unit per pin, is typically 20 ms, regardless of the number of pins, and the number of vectors would be typically fewer than a few thousand.

There is a need for a method and circuit architecture which reduces the circuit node access time via an analog bus from the prior art method that is proportional to the square of the number of pins on the IC.

SUMMARY OF THE INVENTION

The present invention seeks to provide a circuit node sequential access method, and an IEEE 1149.4 compatible circuit for use therewith, in which the time to access a plurality of nodes is linearly proportional to the number of nodes accessed.

The present invention provides a method in which, after the BSRs have been initialized in the manner explained earlier to access the first of a plurality of circuit nodes, the number of clock cycles required to access subsequent circuit nodes may be reduced by simply shifting the switch enabling bit from one BSR to the next while preventing the TAP controller from altering the shifted boundary module bit values during the Capture-DR state and altering the state of other analog switches and/or signal node drivers during the UpdateDR state. This may be achieved by suppressing the capture operation when the TAP controller is sequenced through the Capture-DR state.

The method of the present invention is generally defined as a method for sequentially accessing circuit nodes in an IEEE 1149.4 compatible mixed-signal circuit having a TAP controller, a boundary scan register having boundary modules associated with each circuit node, analog busses for accessing the circuit nodes and connecting analog pins and each boundary module, the boundary modules including an analog boundary module having analog switches for selectively accessing the busses, the boundary register including shift register elements and associated update latches for controlling the analog switches, the method comprising initializing the boundary modules with logic values including an analog switch enabling logic value for enabling a switch associated with the first of the circuit nodes and enabling the switch; monitoring or driving the first signal node via the analog busses; suppressing capture mode in each boundary module; and for each additional circuit node to be accessed, shifting the switch enabling logic value from the boundary module containing the logic value to the next boundary module associated with a next signal node to be accessed and enabling a switch associated therewith; and monitoring or driving the next signal node via the analog bus.

Circuitry, constructed according to the present invention, intercepts control signals between the TAP controller and the ABMs, such that when a register bit is set, the ABM register contents are not altered during the CaptureDR state. When the CaptureDR state is thus prevented from affecting the ABMs, it is possible to update ABM analog switch settings, then shift enabling bits in the scan register from one analog switch controlling register element in an ABM to another ABM, and then perform a second update without an intervening capture. In this way, analog signals at a plurality of analog pins can be accessed with only a few shift clock cycles between each access, without the need to re-initialize the ABMs between circuit node accesses.

According to another aspect of the present invention, there is provided an improvement in an IEEE 1149.4 compatible mixed-signal circuit having a plurality of circuit nodes, analog busses for accessing the signal nodes, a TAP controller having a plurality of states including ShiftDR, UpdateDR and CaptureDR, an analog boundary module associated with each the circuit node, each module having boundary scan cells, each scan cell having an update latch, analog switches for selectively accessing the busses and boundary scan cells for controlling the analog switches, the improvement comprising circuit means for configuring the circuit in a Rapid Access mode to facilitate rapid sequential access of the circuit nodes, the circuit means being the responsive to a Rapid Access enabling signal for suppressing capture in the boundary scan cells to permit serial shifting of logic values in the boundary scan register without altering shifted logic values or the state of other analog switches.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

Figure 1:
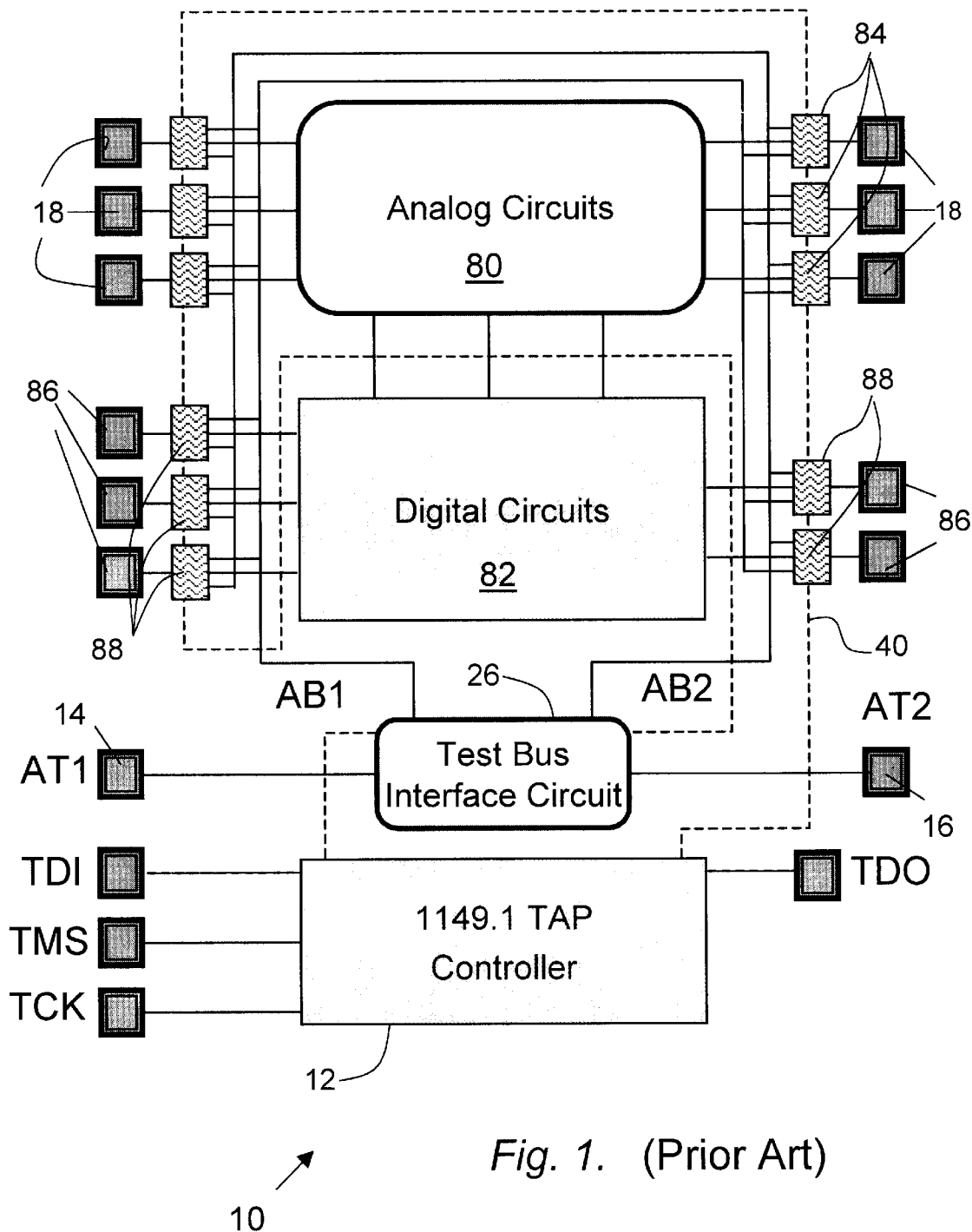
FIG. 1 shows the prior art general architecture of an IC which contains 1149.4 test access circuitry.
Figure 2:
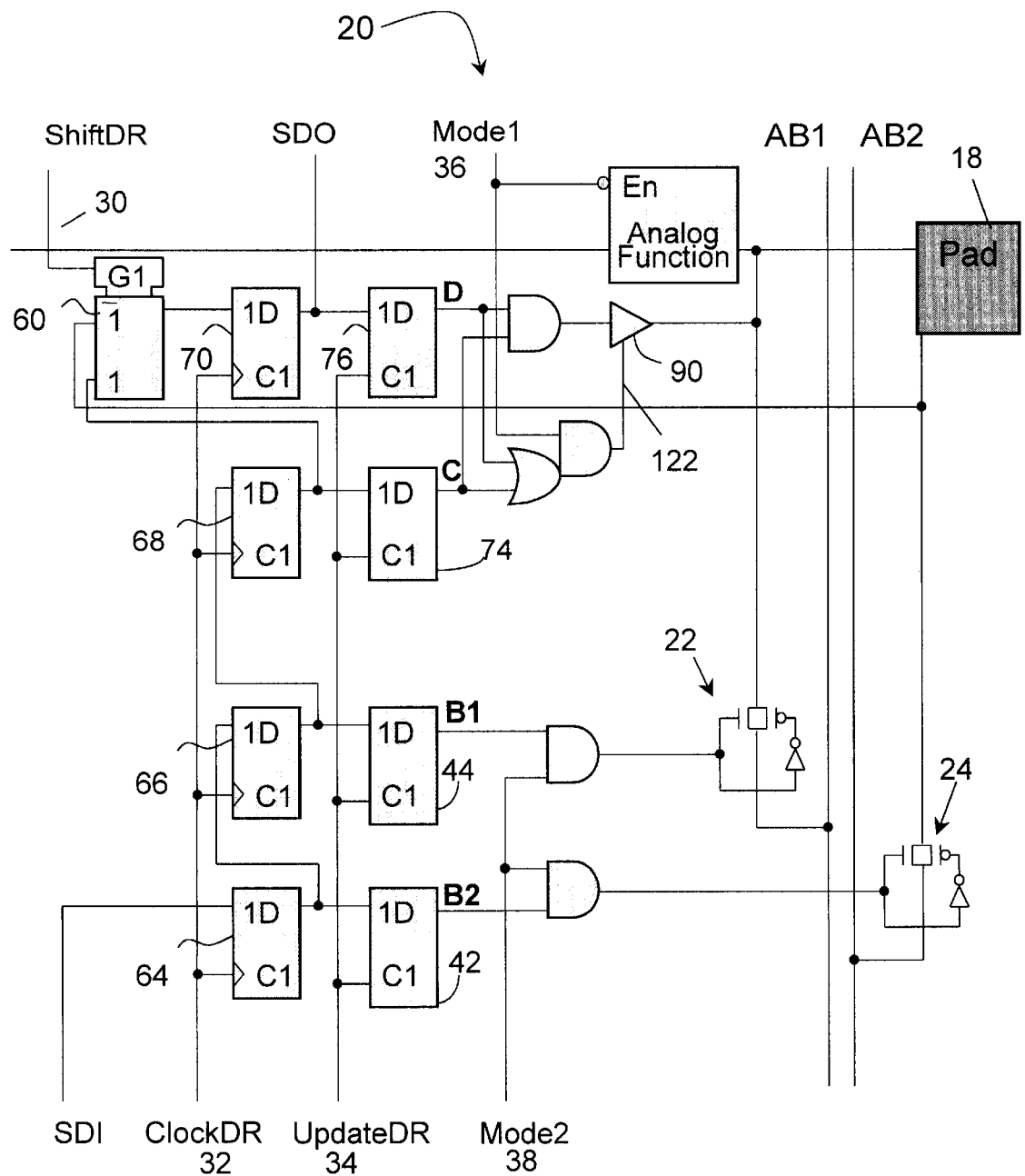
FIG. 2 illustrates a schematic of prior art analog boundary module circuitry.
Figure 3:
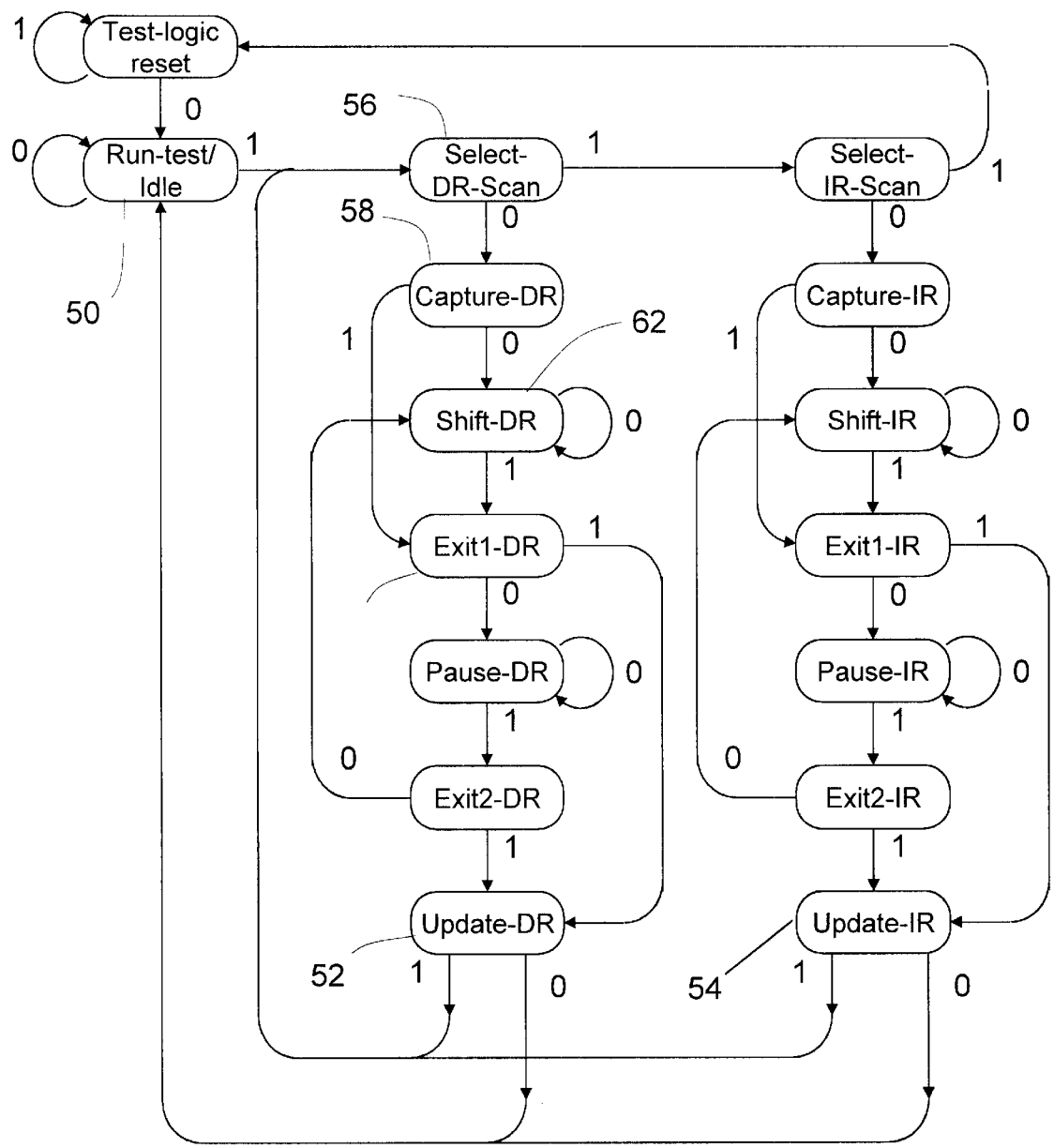
FIG. 3 illustrates the TAP controller state diagram specified by both the 1149.1 and 1149.4 standards.

Before describing the various embodiments of the present invention, it would be useful to describe IC 10 in more detail with reference to FIGS. 1, 2 and 3. As previously mentioned, the circuit includes a TAP controller 12. The controller includes a clock input TCK, a Test Mode Select Input, TMS, for sequencing the controller through the 16 states shown in FIG. 3. The controller also includes a Test Data Input, TDI, for loading (or "shifting" or "scanning") logic values into the IC and a Test Data Output, TDO, for unloading data out of the IC. The IC further includes internal analog circuits 80 and internal digital circuits 82. The analog circuitry is connected to circuit nodes or pins 18 via analog boundary modules 84. The digital circuits are connected to circuit nodes or pins 86 via analog boundary modules or boundary modules 88. A pair of busses AB1 and AB2 connect each of analog boundary modules 84 and 88 to test bus interface circuit 26 and are used to monitor or drive circuit nodes according to the IEEE 1149.4 standard.

The analog boundary modules are illustrated in FIG. 2 and were described earlier. It will be noted that shift register elements 64, 66, 68 and 70 are serially connected between a module Scan Data Input, SDI, and a Scan Data Output SDO, which are serially connected to other modules along previously mentioned scan path 40. The ShiftDR signal output by the TAP is connected to multiplexer 60 and serves to configure shift register elements 64, 66, 68 and 70 in a shift or scan mode when active and in a capture mode when inactive. Update latches 42, 44, 74 and 76 are associated with shift register elements 64, 66, 68 and 70, respectively, and are controlled by TAP controller UpdateDR output signal. Analog switches 22 and 24 are controlled by a mode signal, Mode2, output by the TAP and the logic values in update latches 44 and 42, respectively. The switches are enabled by loading a switch enabling bit, logic 1, into their associated update latches. The circuit further includes 3-state digital driver 90, which is enabled by a logic 1 applied to its control input.

Figure 4:
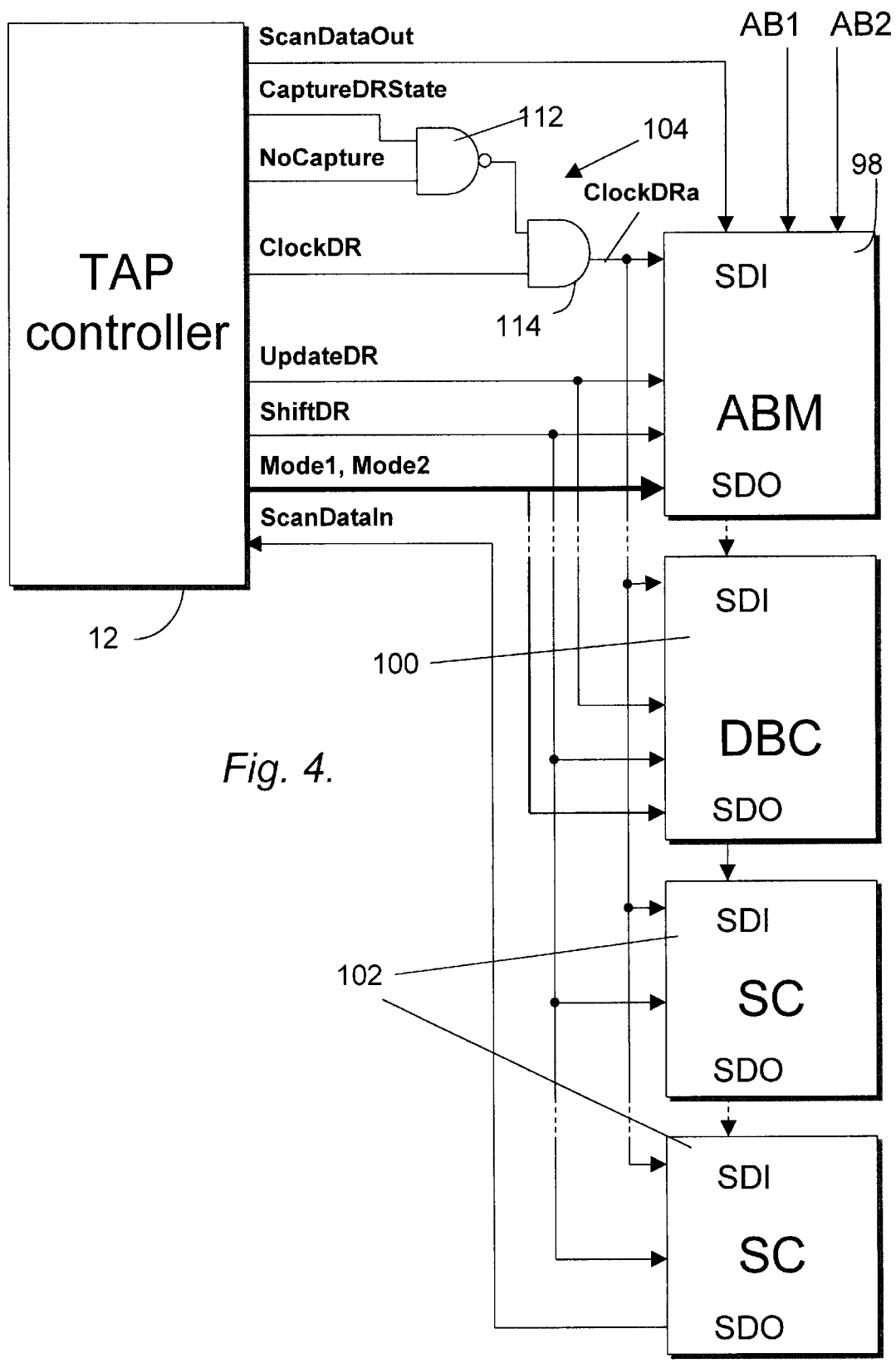
FIG. 4 is a schematic of circuitry that prevents captures during the CaptureDR state of the TAP controller connected to ABMs, according to a first embodiment of the present invention, the circuitry including Digital Boundary Cells, DBC, and scan cells, SC.
Figure 8:
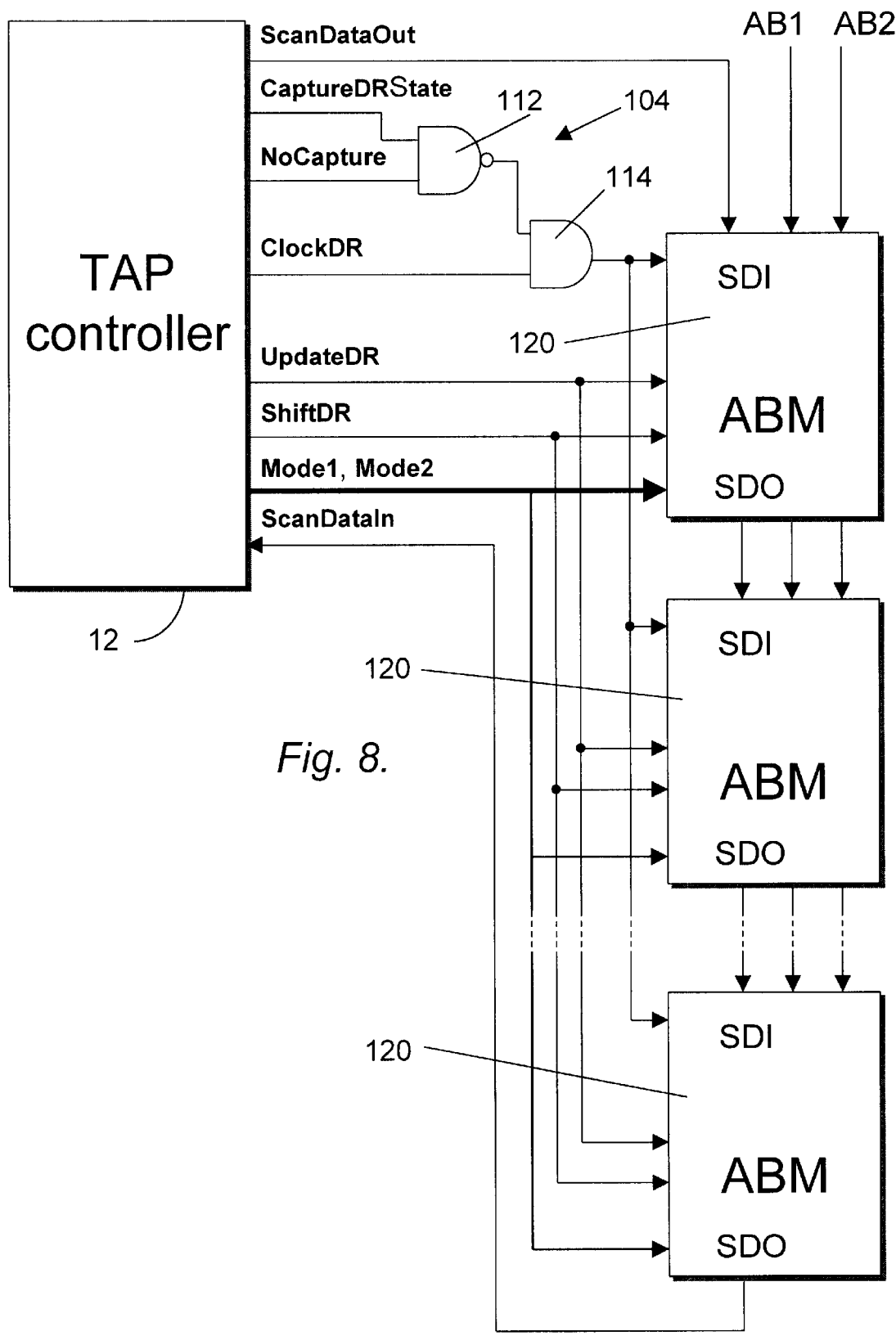
FIG. 8 is a schematic of circuitry, similar to FIG. 4, that prevents captures during the CaptureDR state of the TAP controller connected to ABMs, according to a first embodiment of the present invention.

The present invention seeks to provide a method and circuit for performing a fast sequential access of the circuit pins of one or more ICs. The various embodiments of the present invention will now be described. FIG. 4 and FIG. 8 are similar to one another except that FIG. 4 includes a combination of analog boundary modules 98, digital boundary cells 100 and scan cells 102 while FIG. 8 includes only analog boundary modules 120. As shown, TAP controller 12 is provided with output ClockDR, which is applied to the clock input of shift register elements in the Boundary Modules, including ABMs, DBCs, and SCs; UpdateDR which is applied to the clock input of update latches; ShiftDR which is applied to the multiplexers used to configure shift register elements in shift mode or capture mode, and one or more mode signals, which are used for various purposes not relevant to the present invention. The controller also includes a ScanDataOut output and a ScanDataIn input connected to the previously mentioned SDI and SDO terminals of ABMs, and DBCs.

In accordance with one aspect of the present invention, there is provided a circuit 104 which facilitates fast sequential access to the circuit nodes. The circuit uses additional signals output by the TAP controller, including a CaptureDRState signal and a NoCapture signal.

Figure 7:
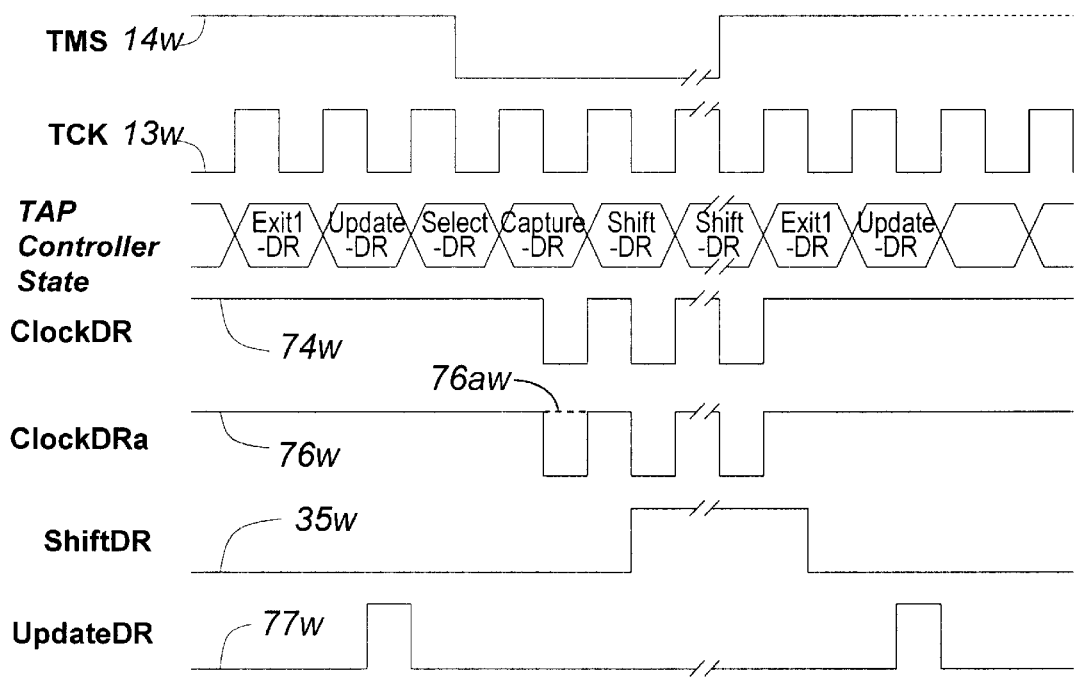
FIG. 7 shows waveforms for the circuit shown in FIG. 6.

The CaptureDRState signal and NoCapture signals are applied to respective inputs of a NAND gate 112 whose output is applied to one input of an AND gate 114 which gates the ClockDR signal (waveform 74w in FIG. 7) and outputs a ClockDRa signal 76w. The other input of AND gate 114 is logic 0 only when the CaptureDRState signal output indicates the TAP controller is in CaptureDR state 58 and the NoCapture output indicates the TAP controller is in a "Rapid Access" mode. By preventing the ClockDR signal from propagating to the DBCs 100 and to the internal SCs, 102, as shown by waveform 76aw, the normal capture function is suppressed. Waveform 76w shows the common ClockDR signal during normal operation, when the NoCapture signal is logic 0. Waveform 76aw shows the signal during the "Rapid Access" mode, when the NoCapture signal is logic 1.

Figure 5:
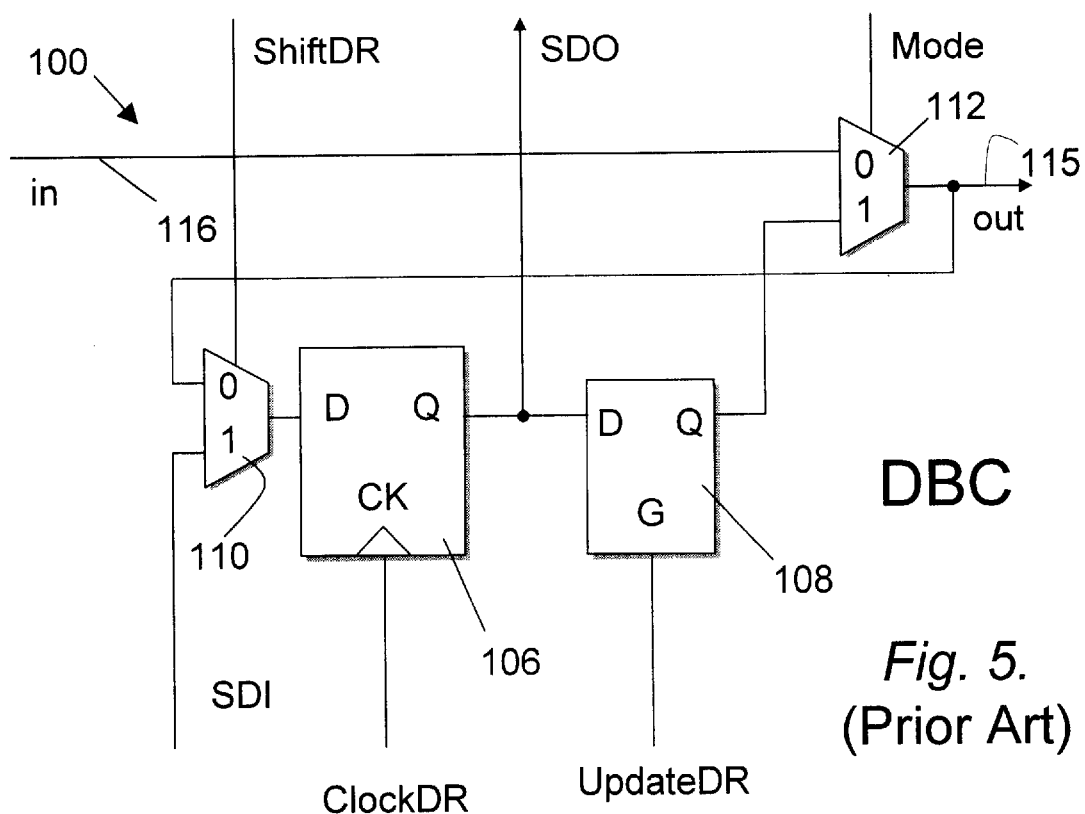
FIG. 5 is a schematic of a prior art digital boundary cell (DBC)

DBCs 100 illustrated in FIG. 4 may be configured as shown in FIG. 5 which illustrates a shift register element 106, an associated update latch 108, and a first multiplexer 110 and a second multiplexer 112. The ShiftDR controller output is applied to the select input of multiplexer 110. The output of shift element 106 is connected to the update latch input and to the cell SDO output. DBC output 115 is fed back and applied to the "0" input of multiplexer 110. The SDI input is applied to the "1" input of multiplexer 110. A DBC input 116 is applied to the "0" input of multiplexer 112.

The output of latch 108 is applied to the "1" input of multiplexer 112. A mode signal is applied to the select input of multiplexer 112. When ShiftDR is logic 1, the DBC is configured in "shift mode" in which all of the boundary modules which comprise the BSR are connected in series for loading or unloading logic values to and from the boundary modules. When ShiftDR is logic 0, the cell is configured in "capture mode" in which the DBC output is applied to the input of the shift register element. A capture operation occurs when a transition occurs on clock signal ClockDR at the clock input of the shift register element. It is this operation which causes "data corruption" as it relates to performing sequential circuit node accesses. The same applies to the ABM circuits.

Figure 6:
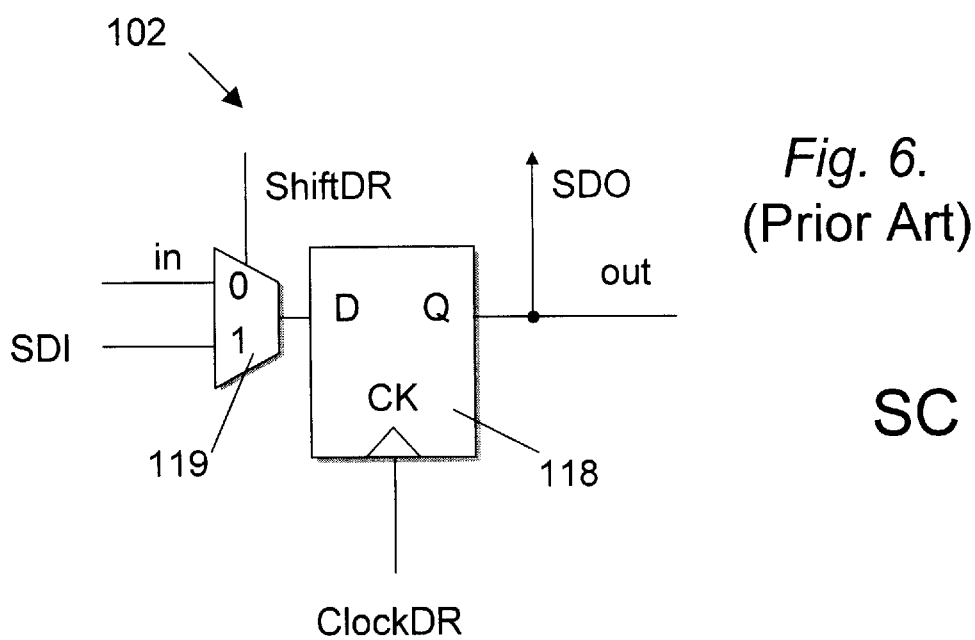
FIG. 6 is a schematic of a prior art non-boundary scan cell (SC)

Internal scan cells 102 may be configured as shown in FIG. 6. The scan cell includes a shift register element 118 clocked by ClockDR and a multiplexer 119 which is controlled by ShiftDR.

FIG. 8 contains the same circuit 104 as shown in FIG. 4. However, in this circuit all of the boundary cells are ABMs 120 as shown in FIG. 2, containing two shift register elements 68 and 70 which control digital functions and two shift register elements 64 and 66 that control analog switches. The enable pin 122 of the digital driver 90 is designed such that the driver is enabled by a logic 1. The analog switches are designed such that each is enabled by a logic 1 in the corresponding register bit.

Returning to circuit 104, the NoCapture signal can be set either by loading an instruction that sets an Instruction Register bit, or by loading a data register bit, or by loading into an additional bit of the BSR. The CaptureDRState signal is typically available in the 1149.1/1149.4 standard TAP controller. The instruction puts the IC and TAP controller into a "Rapid Access" mode which prevents corruption of data in internal data registers when the controller is sequenced through the CaptureDR state to access the ShiftDR state (see FIG. 3).

In accordance with the method of the present invention, there are two basic steps to perform a fast sequential access of a plurality of circuit nodes or pins on the chip. The first step is an initialization step which involves scanning logic values into the serially connected shift register elements of the boundary modules and then loading the logic values into the update latches associated with the shift register elements. The logic values include at least one switch enabling value for enabling at least one analog switch associated with a first circuit node to be accessed. In the embodiments of FIG. 4 and FIG. 8, the logic values are logic 0 except for the switch enabling value which is a logic 1. In other embodiments described later, logic values other than logic 0 may be loaded for non-switch control shift register elements. Upon completion of the initialization step, the first circuit node may be accessed by either monitoring or driving it. Prior to beginning the second step, the NoCapture signal is activated and remains active for the balance of the procedure.

The second step simply comprises, for each subsequent circuit node to be accessed, shifting the switch enabling logic value from one boundary module to the next, updating the latches associated with analog switches which control the circuit node, and accessing the subsequent circuit node. This step is repeated as many times as necessary to access all of the circuit nodes.

In the conventional method, it is necessary to initialize the boundary register each time a circuit pin is accessed. This is necessary because the conventional method permits the normal capture operation to occur when the controller is sequenced through its various states and, therefore, the data is corrupted, in the manner explained above in the description of FIG. 5 and cannot be re-used for accessing additional circuit nodes. It will be seen that, if a BSR comprises N bits, N+4 clock cycles will be required each time a pin is accessed, as explained in detail earlier. The additional four clock cycles are associated with sequencing of the controller to the necessary states for loading and updating data. In contrast, the present invention only requires the same additional four clock cycles plus the clock cycles required to advance the switch enabling logic value from one boundary module to the next, which for an ABM would be four clock cycles for a total of eight clock cycles. The BSR data is not corrupted because the capture operation is suppressed. The number will vary depending on how far it is necessary to advance the switch enabling bit. In a circuit having only ABMs of identical construction, the number of logic 0's scanned in in sub-step 5 above would be four, assuming the switch enabling bit is shifting to a corresponding shift register element in the next ABM. The number of logic 0's is one if the next switch in sequence is located in the current ABM. The number of logic 0's is three if the next switch in sequence is the first switch in the next ABM.

The following is a more technical description of the second step of the present invention. With the NoCapture signal inactive (Logic 0), the controller is sequenced to the ShiftDR state and then an appropriate number of clock cycles are applied to scan in logic values into the TDI input of the IC. When these logic values have been fully loaded, the controller is sequenced to the ClockDR state, which activates the ClockDR signal and updates all update latches and enables the switch of interest. The circuit node may now be monitored or driven.

With the NoCapture signal active, the ClockDR signal is suppressed as the controller is sequenced through the CaptureDR state. Therefore, even though the ShiftDR signal is inactive, which configures the shift register elements in capture mode, the scan modules are unable to perform a capture operation without the clock input. The active NoCapture signal does not affect the shift or scan operation because ClockDR is only disabled during the CaptureDR state.

With reference to the state diagram of FIG. 3, the second basic step of the method comprises the following specific steps: 1. while TMS=1, toggle TCK to proceed from the Run-test/Idle state, the Update-DR state or the Update-IR state to the Select-DR-Scan state; 2 while TMS=0, toggle TCK to proceed from the Select-DR-Scan state to the Capture-DR state, (in which capture is suppressed); 3. while TMS=0, toggle TCK to proceed from the Capture-DR state to the Shift-DR state; 4. while TMS=0, repeatedly toggle TCK to scan in just enough logic zeroes to shift bits to next ABM; 5. while TMS=1, toggle TCK to proceed from the Shift-DR state to the Exit1-DR state; and 6. While TMS=1, toggle TCK to proceed from the Exit1-DR state to the Update-DR state, which updates all latches to output new bit values.

The invention also contemplates enabling two analog switches at a time. To that end, in the initialization step, a pair of sequential logic 1 switch enabling bits are scanned in. This pair of bits is then shifted from one ABM to the next with each sequential circuit node access.

The circuits illustrated in FIG. 4 and FIG. 8 provide the advantage that they may be used without modification of conventional boundary modules (ABMs, DBCs) but do not allow including specific digital driver logic values (unless such values are logic 0's) during the BSR initialization step because such values would be replaced during each of the second and later scan and update operations. The embodiments of FIGS. 9–13 may be used when it is desired to load non-zero logic values and have those values remain active, without corruption, throughout all sequential circuit pin accesses. These embodiments suppress capture as in FIGS. 4 and 8, but additionally provide a mechanism for selectively updating different groups of update latches at different times. More specifically, these embodiments provide mechanisms for updating switch-associated update latches separately from latches which do not control analog switches.

The embodiment of FIG. 9 uses the same circuit 104 illustrated and described with reference to FIG. 4 and FIG. 8. Accordingly, the same reference numerals are used to designate the same parts. However, this circuit uses the normal UpdateDR signal to control update latches that control analog switches and generates a second UpdateDR signal for controlling update latches that do not control analog switches. The second signal is generated by a circuit 130 and is derived by gating first Update signal with the NoCapture signal by means of AND gate 132. AND gate 132 receives the inverted NoCapture signal and the UpdateDR signal and outputs a second UpdateDR signal, labelled, UpdateDRa. When the NoCapture output is in its initial reset state, logic 0, UpdateDRa is the same as the UpdateDR signal as shown by the waveforms 77w and 121w in FIG. 11. When the NoCapture output is set, the UpdateDRa output is set to a constant logic value independent of the UpdateDR signal, as shown by waveform 121aw of FIG. 11. DBCs and SCs could also be connected in the scan path of FIG. 4 and FIG. 8 without affecting the sequence described for the present invention.

The addition of circuit 130 allows modification of the first and second method steps described earlier. In the first method step, logic values other than logic 0's and the switch enabling value may loaded. Thus, digital driver enabling values and any such values may be included without concern that these values will be corrupted during execution of the method. In addition, the first method step is modified by performing two update operations simultaneously in order to (a) update all latches which control analog switches and (b) update all other update latches.

The second method step of the present invention is modified by restricting its update operation to updating only update latches associated with analog switches. This requires a minor modification to the ABMs, as shown in FIG. 10.

Figure 10:
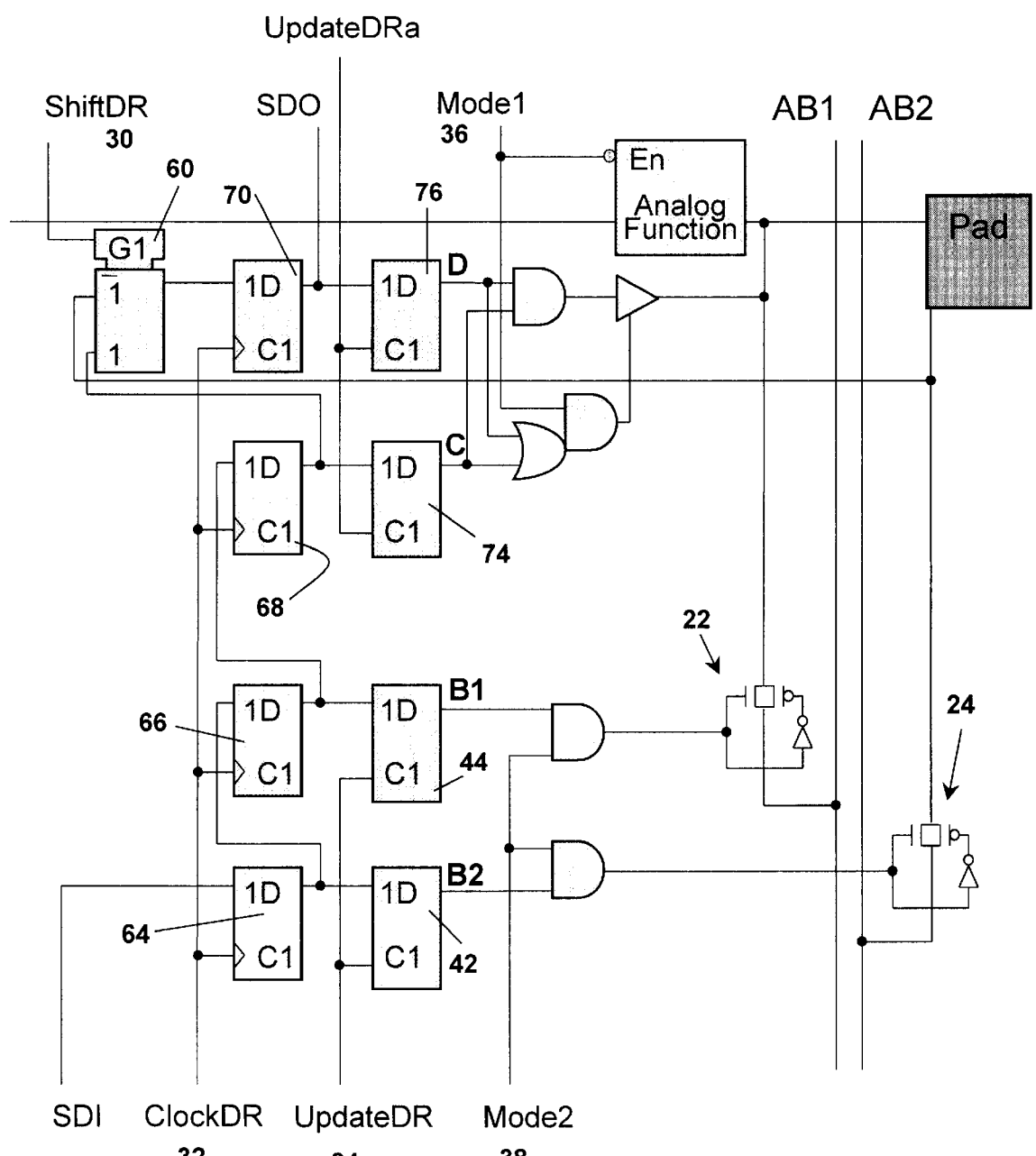
FIG. 10 is a schematic of an ABM that has two UpdateDR control inputs according to an embodiment of the present invention.
Figure 11:
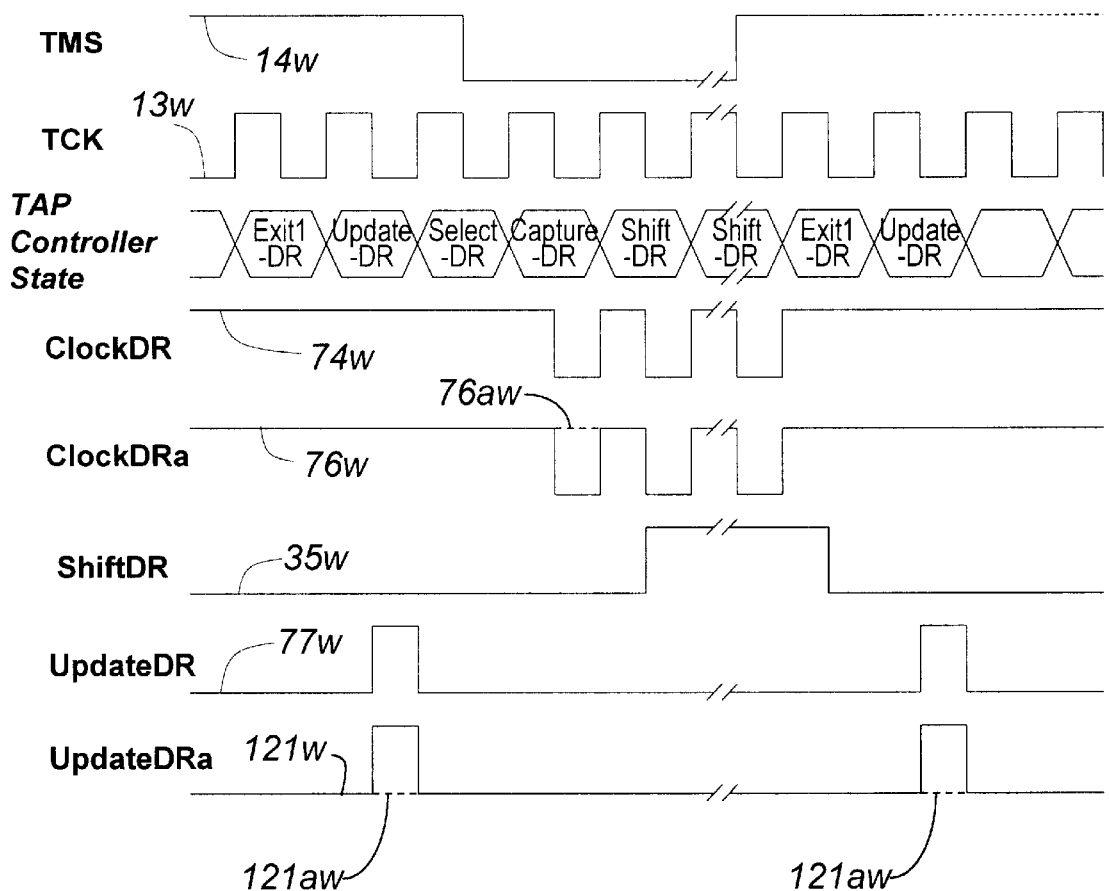
FIG. 11 illustrates waveforms for the circuit shown in FIG. 9 and FIG. 10.

FIG. 10 illustrates an ABM adapted to use the second UpdateDR signal. The circuit is substantially the same as the previously described ABM circuit (FIG. 2) and, accordingly the same reference numerals have been used to designate the same parts. It will be noted that UpdateDRa is connected to the clock input of each of update latches 74 and 76 while the UpdateDR signal is connected to the clock input of each of update latches 42 and 44, which control analog switches 24 and 22, respectively.

Figure 12:
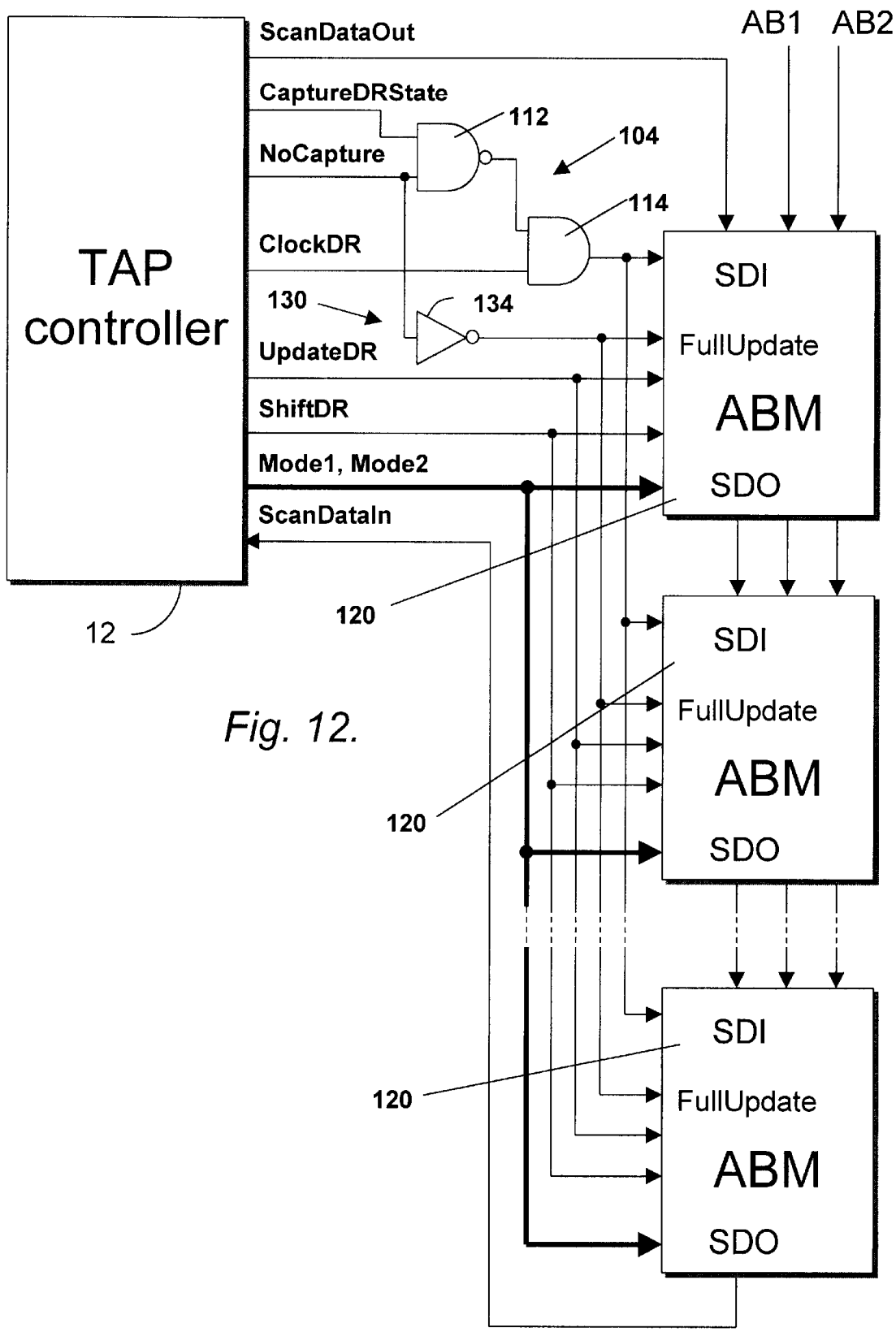
FIG. 12 shows a schematic of circuitry that generates a FullUpdate signal to control whether the ABMs update all register bits or only a subset of register bits, according to a third embodiment of the present invention.
Figure 13:
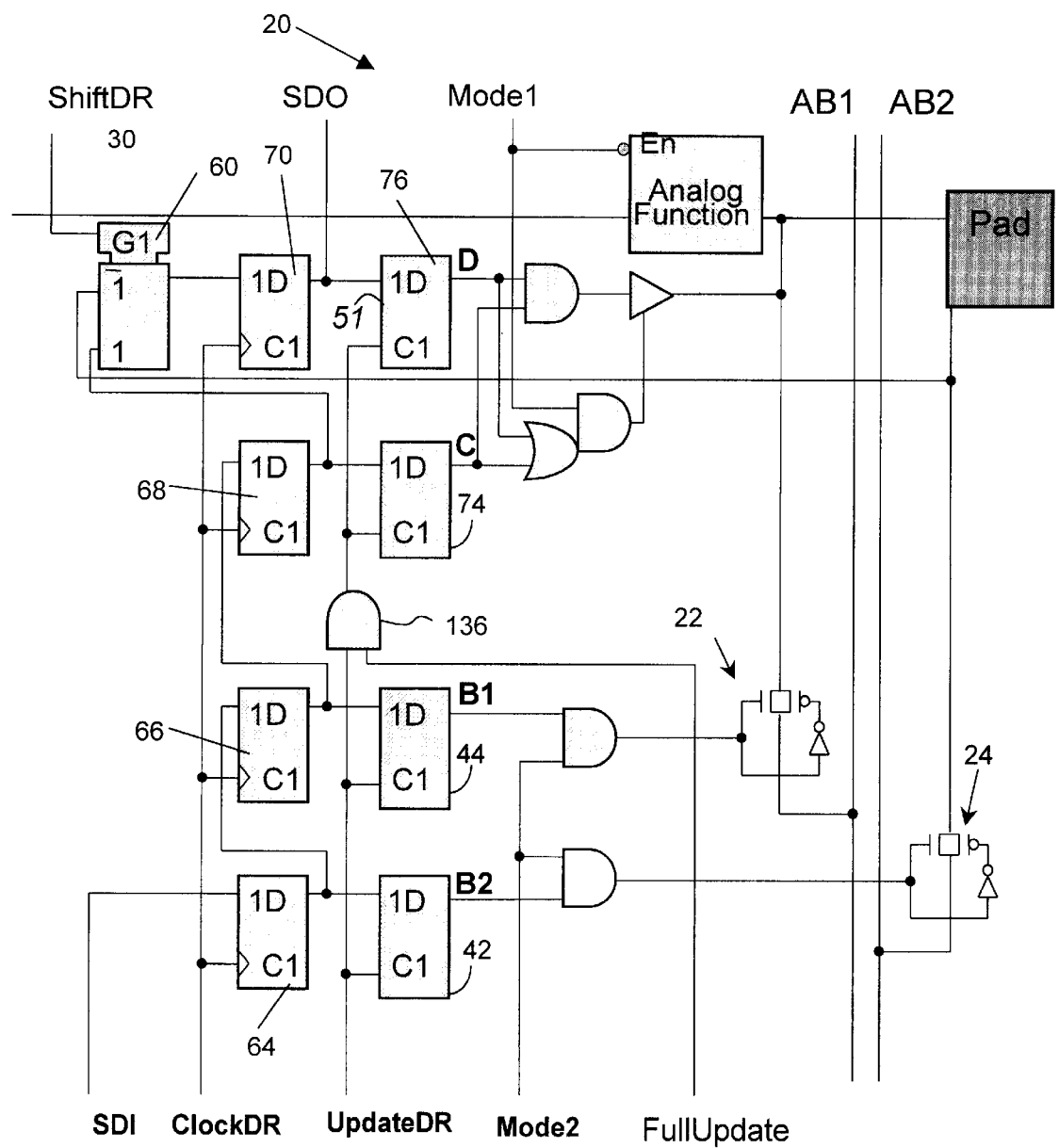
FIG. 13 is a circuit schematic of an ABM having a control input for disabling updates for two latches, according to an embodiment of the present invention.

FIG. 12 provides an alternative arrangement for updating two groups of update latches independently. In this case, circuit 130 provides an inverter 134 which receives the NoCapture output and generates an output, labelled FullUpdate, which is applied to each of the ABMs. Referring to FIG. 13, which illustrates an ABM especially adapted for use with the circuit of FIG. 12, it will be seen that FullUpdate is applied to one input of an AND gate 136. The other input to the AND gate is the UpdateDR signal. The output of AND gate 136 is applied to the clock inputs of update latches 74 and 76. This embodiment would be particularly useful in situations where locally generated signals are desired as compared to the centrally generated signals provided by the previous embodiment.

Figure 9:
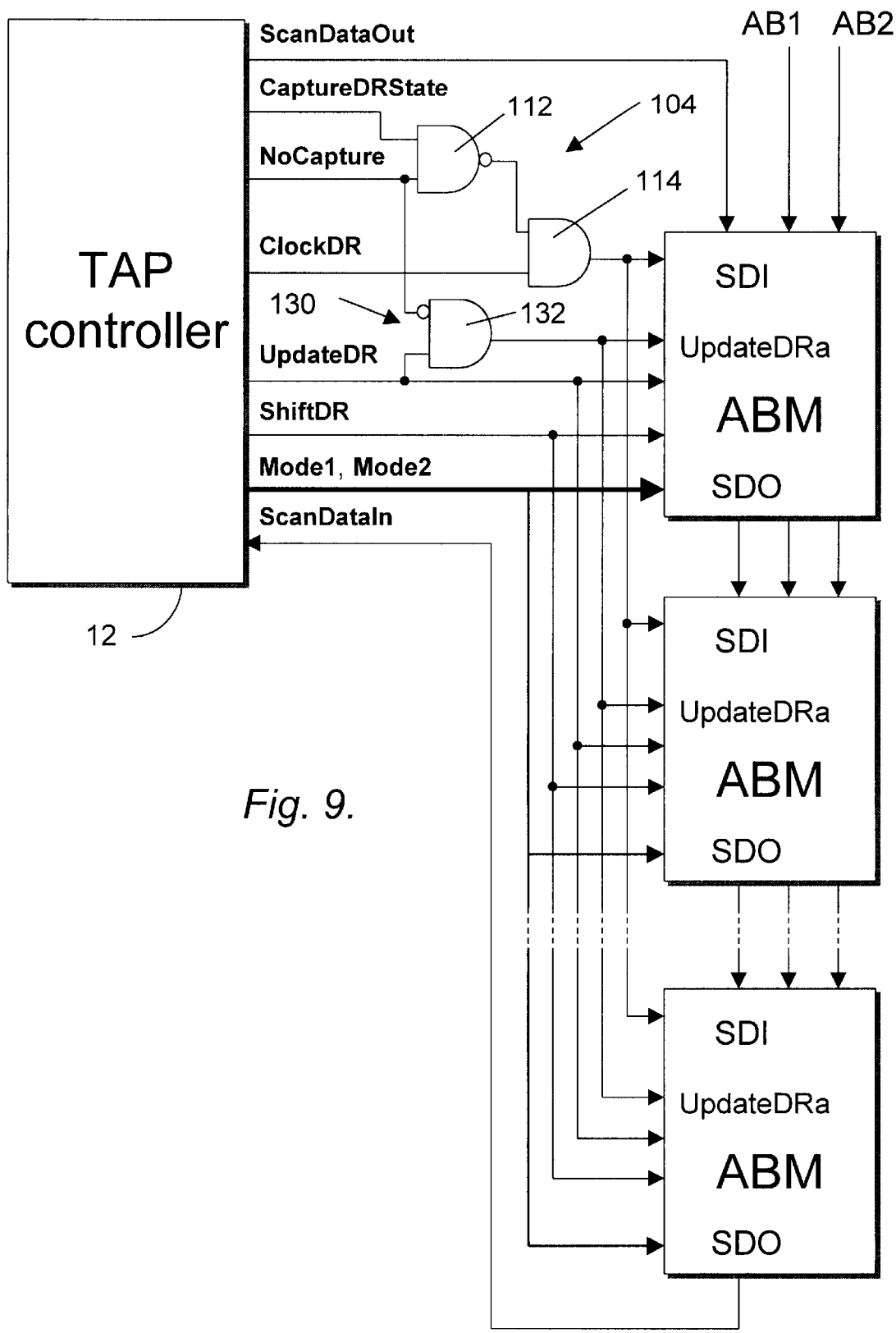
FIG. 9 is a schematic of circuitry, similar to FIG. 8, but which additionally generates a second UpdateDR signal, according to a second embodiment of the present invention

The method used with the embodiment of FIG. 12 is the same as that of FIG. 9. The same method can be used for a plurality of chips on a circuit board. In that situation, the boundary scan registers of two or more ICs are serially connected to define one large shift register. The method of the present invention can then be used to sequentially access the circuit nodes of all ICs in one sequence.

In summary, the circuits described and shown in FIG. 4–FIG. 13 facilitate fast analog access to a plurality of pins on an IC, with as few as eight TCK clock cycles between each access, independent of the number of pins on the IC. For an IC with P pins, as described in the Introduction, N=4P+4 bits are needed to load the BSR, hence this number of bits must be loaded to provide analog access to the first pin. For P>100, N is approximately equal to 4P.

To access each subsequent pin, eight clock cycles are needed. The total time per measurement is therefore:

$$4P/f_{TCK}+P(T_{Measure}+8/f_{TCK})=P(T_{Measure}+12/f_{TCK})$$

which is linearly proportional to the number of pins.

The total time to measure/apply 6 voltages for an IC with P pins is:

$$6P(T_{Measure}+12/f_{TCK})$$

For an IC with 100 signal pins, $F_{TCK}$=10 MHz, and $T_{Measure}$=10 $\mu$s, the test time would be approximately 6.7 ms, and the number of test vectors would be 67,000. For an IC with 1000 signal pins and $f_{TCK}$=10 MHz, the test time would be approximately 61.2 ms, and the number of test vectors would be 612,000. Compared with the 2.7 seconds required for conventional method, these test times are between 4 and 40 times faster than the boundary scan-based prior art described herein, and comparable to prior art tests that directly access all pins of an IC.

Although the present invention has been described in detail with regard to preferred embodiments and drawings of the invention, it will be apparent to those skilled in the art that various adaptions, modifications and alterations may be accomplished with departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

I claim:

1. A method for sequentially accessing circuit nodes in an IEEE 1149.4 compatible mixed-signal circuit having a test access port controller having a plurality of states including ShiftDR, UpdateDR and CaptureDR, a boundary scan register having a boundary module associated with each said circuit node, analog busses for accessing said circuit nodes and connecting said analog pins and each said boundary module, said boundary modules including an analog boundary module having analog switches for selectively accessing said busses, shift register elements and associated update latches for controlling said analog switches, said method comprising:

initializing said boundary modules with logic values including an analog switch enabling logic value for enabling an analog switch associated with a first circuit node and enabling said associated analog switch;

monitoring or driving said first signal node via said analog busses;

suppressing capture operation in each said boundary modules; and for each additional circuit node to be accessed:
shifting said switch enabling logic value from a boundary module containing said switch enabling logic value to the next boundary module associated with a next signal node to be accessed and enabling the analog switch associated therewith; and
monitoring or driving said next signal node via the analog bus.

2. A method as defined in claim 1, said initializing said boundary modules with logic values including serially loading a logic 0 for each shift register element in said boundary shift register, and a logic 1 for a shift register element that controls the first analog switch to be enabled.

3. A method as defined in claim 1, said suppressing capture operation including generating a signal for disabling the clock signal applied to said shift register elements when said controller is in said CaptureDR state.

4. A method as defined in claim 1, said initializing said boundary modules with logic values including serially loading a logic 0 for each shift register element in said boundary shift register, a logic 1 for a shift register element that controls the first analog switch to be enabled and for each digital driver in said boundary scan register, and further including updating all update latches associated with said shift register elements when all logic values have been loaded; said enabling an analog switch associated therewith including updating all update latches that control analog switches.

5. A method as defined in claim 1, said initializing said boundary modules with logic values including updating all update latches associated with shift register elements in said boundary modules; and said shifting said switch enabling logic value from a boundary module including updating only update latches associated with shift register elements that control analog switches.

6. A method as defined in claim 5, including a first update signal for controlling update latches that control analog switches and a second update signal for controlling all other update latches, said updating all update latches including activating said first and said second update signals in said UpdateDR state of said controller and said updating only update latches including activating said second update signal and de-activating said second update signal in said UpdateDR state of said controller.

7. A method for sequentially accessing circuit nodes in an IEEE 1149.4 compatible mixed-signal circuit having analog busses for accessing said signal nodes, a test access port controller, an analog boundary module associated with each said circuit node, each module having shift register elements, each shift register element having an associated update latch, and analog switches for selectively accessing said busses, a plurality of said shift register elements and associated update latches controlling said analog switches, said method comprising:

accessing a first of said circuit nodes including:
serially loading logic values into said boundary modules, said logic values including an analog switch enabling logic value for enabling an analog switch associated with said first of said circuit nodes;
activating an update signal to update the latch output of update latches associated boundary modules so as to enable said analog switch associated with said first of said circuit nodes;

monitoring or driving said first signal node via said analog bus; and for each additional circuit node to be accessed:
without performing a capture of the signal node logic values and without enabling other analog switches, serially loading additional logic values into said boundary modules until said analog switch enabling logic value is shifted to the next boundary module that controls a next analog switch associated with a next signal node in sequence to be accessed;

activating an update signal to disable said first analog switch and enable said next analog switch; and monitoring or driving the second signal node via the analog bus.

8. A method as defined in claim 7, said serially loading logic values including loading logic 0's to disable all signal node drivers and analog switches, except for a single logic 1 for a boundary module that controls an analog switch associated with said first of said circuit nodes; and said serially loading additional logic values comprising serially loading logic 0's.

9. A method as defined in claim 7, said serially loading logic values including loading logic 0's for disabling all signal node drivers and analog switches, except for two logic 1's for boundary modules which control two analog switches associated with said first of said circuit nodes; and said serially loading additional logic values comprising serially loading logic 0's.

10. A method as defined in claim 7, further including, following said serial loading, loading a logic value into an additional latch associated with each of predetermined boundary modules for preventing updating of said update additional latches; and said activating an update signal to cause the first analog switch to be disabled including, for each boundary module whose updating has not been prevented by said additional latch, updating update latch output values by a transition of the first update signal, to disable said first analog switch and enable said next analog switch.

11. A method as defined in claim 7, said activating an update signal to update the latch output including applying a first update signal to each said update latch, and said activating an update signal to cause the first analog switch to be disabled including applying a second update signal to update latches which control said analog switches.

12. A method as defined in claim 7, further including:
generating a first update signal input for each boundary module that controls digital drivers that drive the signal nodes;

generating a second update signal for each boundary module that controls analog switches; and applying a programmable register bit for controlling whether, during an UpdateDR state of said TAP controller, the first and second update signals are activated in unison or only the second update signal is activated.

13. A method as defined in claim 7, said serially loading including loading logic values that cause signal node drivers to drive signals nodes to predetermined logic states.

14. A method for sequentially accessing circuit nodes in an IEEE 1149.4 compatible mixed-signal circuit having analog busses for accessing said signal nodes, a test access port controller, an analog boundary module associated with each said circuit node, each module having shift register elements, associated update latches, a pair of analog switches for selectively accessing said busses and shift register elements for controlling said analog switches, said controller having a plurality of states including a ShiftDR for loading logic values into said boundary modules, CaptureDR for capturing the signal at the input of a boundary scan shift register element, and UpdateDR for updating latches associated with said shift register element, said method comprising:

accessing a first of said circuit nodes including:
configuring said controller in said ShiftDR sate and serially loading logic values into said boundary modules, said logic values including an analog switch enabling logic value for enabling an analog switch associated with said first of said circuit nodes;

configuring said controller in said UpdateDR state to update the latch output of update latches associated with said boundary modules so as to enable said analog switch associated with said first of said circuit nodes and disable all other switches;

monitoring or driving said first signal node via one or both of said analog buses;

for each additional circuit node to be accessed:
configuring said controller in said ShiftDR state including:
disabling the clock input of said update latch to suppress capture as said controller passes through said CaptureDR state and serially loading additional logic values into said boundary modules until said analog switch enabling logic value is shifted to the next boundary module in sequence that controls a next analog switch connected to a next signal node in sequence to be accessed;

configuring said controller in said UpdateDR state to update the latch output of update latches associated with said analog switches to activate said switch enabling logic value in said next analog switch to be enabled; and monitoring or driving the second signal node via the analog bus.

15. A method as defined in claim 14, said suppressing capture including disabling the clock signal applied to update latches associated with said boundary modules.

16. A method for sequentially accessing circuit nodes in a circuit having IEEE 1149.4 compatible mixed-signal integrated circuits each having a test access port controller having a plurality of states including ShiftDR, UpdateDR and CaptureDR, a boundary scan register having a boundary modules associated with each said circuit node, analog busses for accessing said circuit nodes and connecting said controller and each said boundary module, said boundary modules including an analog boundary module having analog switches for selectively accessing said busses, shift register elements and associated update latches for controlling said analog switches, said method comprising:

initializing said boundary modules with logic values including an analog switch enabling logic value for enabling an analog switch associated with a first circuit node and enabling said associated analog switch;

monitoring or driving said first signal node via said analog busses;

suppressing capture operation in each said boundary modules; and for each additional circuit node to be accessed:
shifting said switch enabling logic value from a boundary module containing said switch enabling logic value to the next boundary module associated with a next signal node to be accessed and enabling the analog switch associated therewith; and monitoring or driving said next signal node via the analog bus.

17. In an IEEE 1149.4 compatible mixed-signal circuit having a plurality of circuit nodes, analog busses for accessing said signal nodes, a test access port controller having a plurality of states including ShiftDR, UpdateDR and CaptureDR, an analog boundary module associated with each said circuit node, each module having boundary modules, each module having an update latch, analog switches for selectively accessing said busses and boundary modules for controlling said analog switches, the improvement comprising:

circuit means for configuring said circuit in a rapid access mode to facilitate rapid sequential access of said circuit nodes, said circuit means being responsive to a rapid access enabling signal for suppressing capture in said boundary modules to permit serial shifting of logic values in said boundary scan register without altering shifted logic values to be altered or the state of other analog switches.

18. A circuit as defined in claim 17, further including circuit means for independently updating latches which control said analog switches from other latches in said boundary modules.

19. A circuit as defined in claim 18, said circuit for configuring including means responsive to an active CaptureDR state signal and an active rapid access mode signal for suppressing a clock signal applied to shift register elements in said boundary modules.

20. A circuit as defined in claim 19, said circuit means for independently updating including means responsive to an inactive rapid access mode signal for enabling updating of all update latches in said boundary module and responsive to an active rapid access mode signal for enabling updating only of update latches in said boundary module which control said switches.

21. A circuit as defined in claim 20, said controller generating a first latch update signal in said UpdateDR state, said first latch update signal being connected to the clock input of each update latch which controls an analog switch, said circuit means for independently updating generating a second latch update signal in response to an active rapid access mode signal, said second latch update signal being connected to the clock input of latches which do not control analog switches.

* * * * *